US010115341B2

(12) United States Patent
Kong et al.

(10) Patent No.: US 10,115,341 B2
(45) Date of Patent: Oct. 30, 2018

(54) ORGANIC LIGHT EMITTING DISPLAY

(71) Applicant: LG DISPLAY CO., LTD., Seoul (KR)

(72) Inventors: Namyong Kong, Paju-si (KR); Woosup Shin, Paju-si (KR); Kwonshik Park, Seoul (KR); Chonghun Park, Paju-si (KR); Uijin Chung, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/184,599

(22) Filed: Jun. 16, 2016

(65) Prior Publication Data

US 2016/0300528 A1 Oct. 13, 2016

Related U.S. Application Data

(63) Continuation of application No. 14/078,796, filed on Nov. 13, 2013, now Pat. No. 9,396,679.

(30) Foreign Application Priority Data

Dec. 17, 2012 (KR) .................... 10-2012-0147751

(51) Int. Cl.
*G09G 3/3233* (2016.01)
*G09G 3/325* (2016.01)
(Continued)

(52) U.S. Cl.
CPC .......... *G09G 3/3233* (2013.01); *G09G 3/325* (2013.01); *G09G 3/3266* (2013.01);
(Continued)

(58) Field of Classification Search
CPC .... G09G 3/3233; G09G 3/3266; G09G 3/325; G09G 3/3283; G09G 2300/043; G09G 2300/0469; G09G 2300/0809; G09G 2300/0842; G09G 2320/0233; G09G 2320/0295; G09G 2320/043; H01L 27/3265; H01L 29/78645; H01L 27/3262; H01L 27/78645; H01L 27/1214
See application file for complete search history.

(56) References Cited

U.S. PATENT DOCUMENTS

2006/0208971 A1 9/2006 Deane
2008/0048951 A1* 2/2008 Naugler, Jr. ........... G09G 3/006
345/82
(Continued)

*Primary Examiner* — Amr Awad
*Assistant Examiner* — Wing Chow
(74) *Attorney, Agent, or Firm* — Seed Intellectual Property Law Group LLP

(57) ABSTRACT

An organic light emitting display includes a display panel, which includes a plurality of pixels and displays an image, and a data driving circuit differently outputting a compensation voltage depending on a sensing value based on a driving current. Each of the plurality of pixels includes an organic light emitting diode, a driving thin film transistor (TFT) having a double gate structure including a main gate electrode and a sub-gate electrode, a switching TFT applying a data voltage determining the driving current to the main gate electrode of the driving TFT, and a compensation TFT applying the compensation voltage for compensating for a shift amount of a threshold voltage of the driving TFT to the sub-gate electrode of the driving TFT.

11 Claims, 14 Drawing Sheets

(51) Int. Cl.
G09G 3/3266 (2016.01)
G09G 3/3283 (2016.01)
H01L 27/32 (2006.01)
H01L 29/786 (2006.01)
H01L 27/12 (2006.01)

(52) U.S. Cl.
CPC ....... *G09G 3/3283* (2013.01); *H01L 27/3262* (2013.01); *H01L 27/3265* (2013.01); *H01L 29/78645* (2013.01); *G09G 2300/043* (2013.01); *G09G 2300/0469* (2013.01); *G09G 2300/0809* (2013.01); *G09G 2300/0842* (2013.01); *G09G 2320/0233* (2013.01); *G09G 2320/0295* (2013.01); *G09G 2320/043* (2013.01); *H01L 27/1214* (2013.01)

(56) References Cited

U.S. PATENT DOCUMENTS

| | | | |
|---|---|---|---|
| 2009/0174628 A1* | 7/2009 | Wang | G09G 3/3225 345/76 |
| 2010/0053041 A1* | 3/2010 | Abe | G09G 3/325 345/76 |
| 2010/0225630 A1* | 9/2010 | Levey | G09G 3/3233 345/211 |
| 2010/0271349 A1* | 10/2010 | Liu | G09G 3/3225 345/205 |
| 2012/0007084 A1* | 1/2012 | Park | H01L 27/1225 257/59 |
| 2012/0249510 A1 | 10/2012 | Jankovic et al. | |

* cited by examiner

ORGANIC LIGHT EMITTING DISPLAY

The present patent document is a continuation of U.S. patent application Ser. No. 14/078,796, filed on Nov. 13, 2013, which claims the benefit of priority to Korea Patent Application No. 10-2012-0147751 filed on Dec. 17, 2012, which is incorporated herein by reference for all purposes as if fully set forth herein.

BACKGROUND

Field of the Disclosure

Embodiments of the disclosure relate to an active matrix organic light emitting display, and more particularly, to an organic light emitting display capable of compensating for the degradation of a driving thin film transistor.

Discussion of the Related Art

An active matrix organic light emitting display includes organic light emitting diodes (hereinafter, abbreviated to "OLEDs") capable of emitting light by itself and has advantages of a fast response time, a high light emitting efficiency, a high luminance, a wide viewing angle, etc.

The OLED serving as a self-emitting element includes an anode electrode, a cathode electrode, and an organic compound layer formed between the anode electrode and the cathode electrode. The organic compound layer includes a hole injection layer HIL, a hole transport layer HTL, a light emitting layer EML, an electron transport layer ETL, and an electron injection layer EIL. When a driving voltage is applied to the anode electrode and the cathode electrode, holes passing through the hole transport layer HTL and electrons passing through the electron transport layer ETL move to the light emitting layer EML and form excitons. As a result, the light emitting layer EML generates visible light.

The organic light emitting display arranges pixels each including an OLED in a matrix form and adjusts a luminance of the pixels based on a gray scale of video data. Each of the pixels includes a driving thin film transistor (TFT) controlling a driving current flowing in the OLED based on a gate-source voltage, a capacitor for uniformly holding a gate voltage of the driving TFT during one frame, and a switching TFT storing a data voltage in the capacitor in response to a gate signal. The luminance of the pixel is proportional to a magnitude of the driving current flowing in the OLED.

The organic light emitting display has disadvantages in that threshold voltages of the driving TFTs of the pixels are differently changed depending on a formation position due to reasons of a process deviation, etc., or electrical characteristics of the driving TFTs are degraded due to a gate-bias stress increased as a driving time passed. When the electrical characteristics of the driving TFT are degraded, a current characteristic curve of the driving TFT is shifted. Therefore, it is difficult to achieve a desired luminance, and life span of the organic light emitting display is reduced.

To solve these problems, in a related art, as shown in FIG. 1, after a deviation between electrical characteristics of driving TFTs of pixels P, i.e., a deviation between threshold voltages of the driving TFTs of the pixels P is sensed by a driver integrated circuit (IC) DIC, an internal operation is performed. A luminance difference resulting from the deviation between the threshold voltages is compensated by adjusting the pixel data for the implementation of an image with reference to a result of the internal operation.

For example, as shown in FIG. 2, when a positive stress is applied to a gate electrode of the driving TFT for a long time to increase the threshold voltage of the driving TFT from 'Vth1' to 'Vth2' by 'φ', and a current characteristic curve of the driving TFT is right shifted from 'A' to 'B', a current flowing between drain and source electrodes of the driving TFT is reduced from 'I1' to 'I2' by 'ΔI' under the same conditions. In FIG. 2, 'Vgs' denotes a gate-source voltage of the driving TFT. To compensate for a reduction in the current, the related art adopts a method for greatly modulating a data voltage applied to the gate electrode of the driving TFT by an increase amount 'φ' of the threshold voltage while holding the current characteristic curve of the driving TFT in a degraded state 'B'. The positive stress the gate electrode of the driving TFT feels is proportional to a magnitude of an driving voltage as well as a length of an driving time. Thus, in the related art, a magnitude (Vth2+φ) of the data voltage applied to the driving TFT has to gradually increase, so as to compensate for the degradation of the driving TFT. As a result, as shown in FIG. 3, the degradation of the driving TFT is accelerated in a compensation process.

Further, as shown in FIG. 4, a range of the voltage the driver IC DIC can output is previously determined depending on its object. Therefore, when a magnitude of a desired compensation voltage exceeds a compensation voltage range (i.e., 16V−12V=4V) of the driver IC DIC due to the excessive degradation of the driving TFT, it is impossible to compensate for the degradation of the driving TFT. The problem is caused because the degradation characteristic of the driving TFT is not saturated at a time point but continued. Further, the problem is caused because the magnitude of the voltage capable of compensating for the degradation of the driving TFT is limited.

The related art compensation method has the problems of the narrow compensation range and a limitation of the compensation range, and thus it is difficult to solve the non-uniformity of the luminance and the reduction in the life span of the organic light emitting display resulting from the degradation of the driving TFT.

SUMMARY

An organic light emitting display comprises a display panel including a plurality of pixels to display an image, and a data driving circuit configured to differently output a compensation voltage depending on a sensing value based on a driving current, wherein each of the plurality of pixels includes an organic light emitting diode, a driving thin film transistor (TFT) having a double gate structure including a main gate electrode and a sub-gate electrode, a switching TFT configured to apply a data voltage that determines the driving current to the main gate electrode of the driving TFT, and a compensation TFT configured to apply the compensation voltage to compensate for a shift amount of a threshold voltage of the driving TFT to the sub-gate electrode of the driving TFT.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Exemplary embodiments of the invention will be described with reference to FIGS. 5 to 12C.

Figure 1:
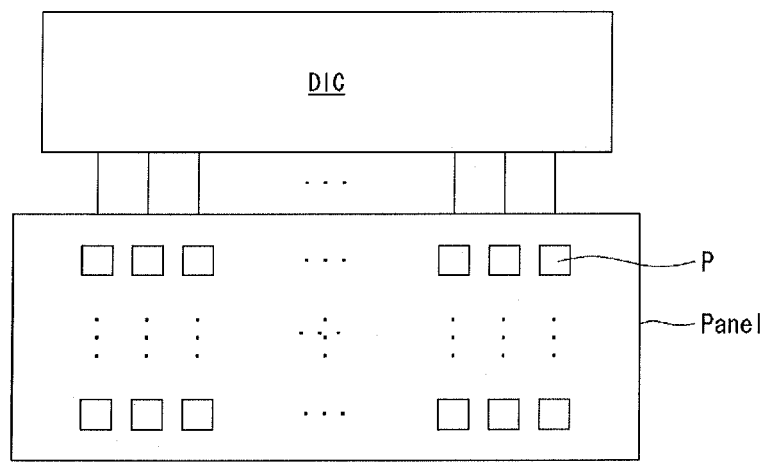
FIG. 1 schematically illustrates a connection relationship between a driver integrated circuit (IC) and a display panel.
Figure 2:
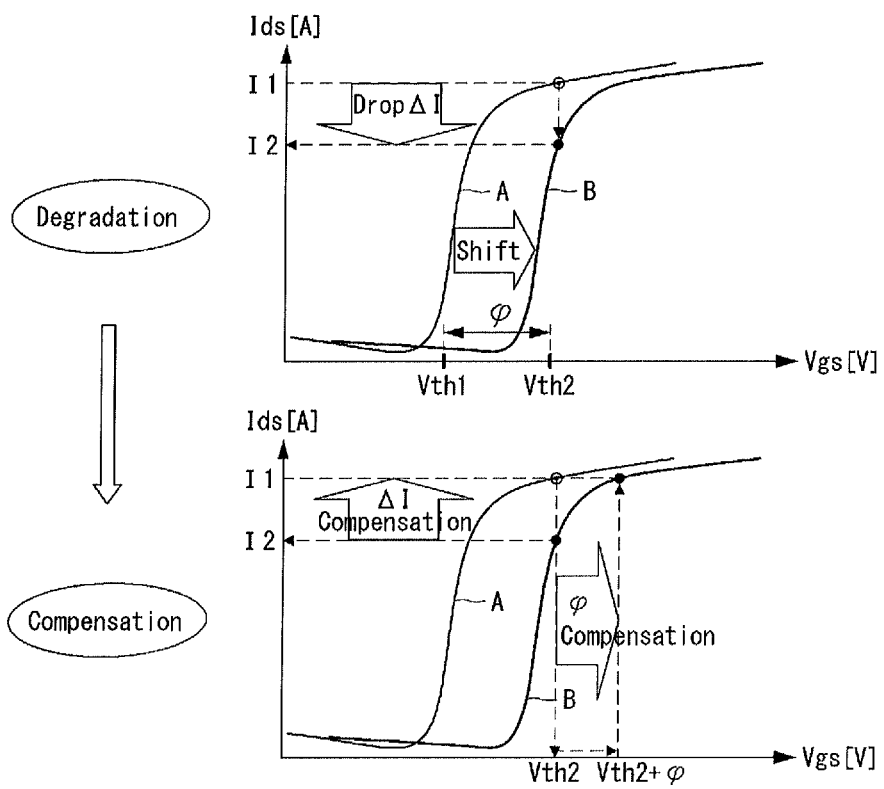
FIG. 2 illustrates a related art method of compensating for the degradation.
Figure 3:
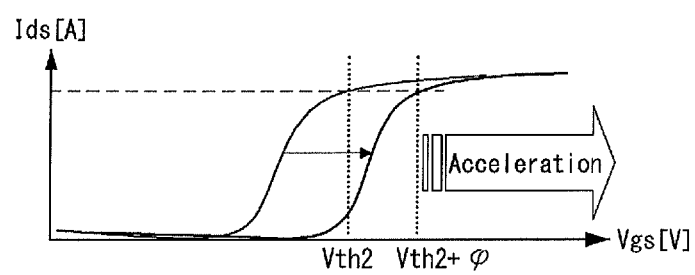
FIG. 3 illustrates that the degradation is accelerated by the compensation in a related art method of compensating for the degradation.
Figure 4:
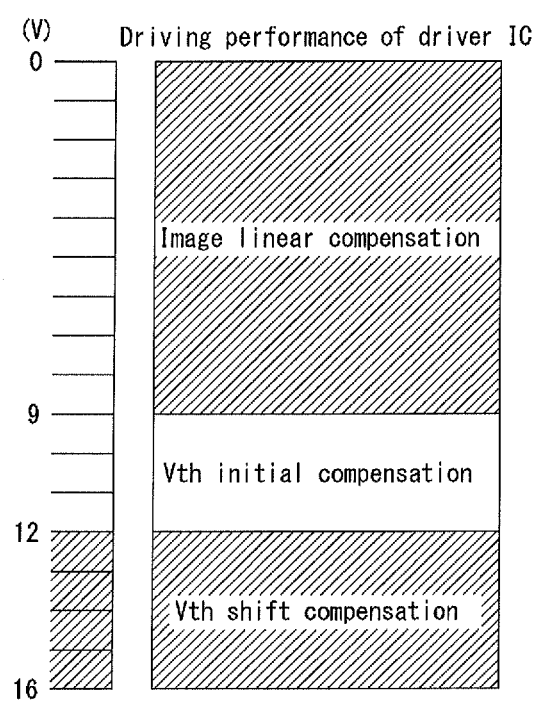
FIG. 4 illustrates an example of a range of a voltage a driver IC can output.
Figure 5:
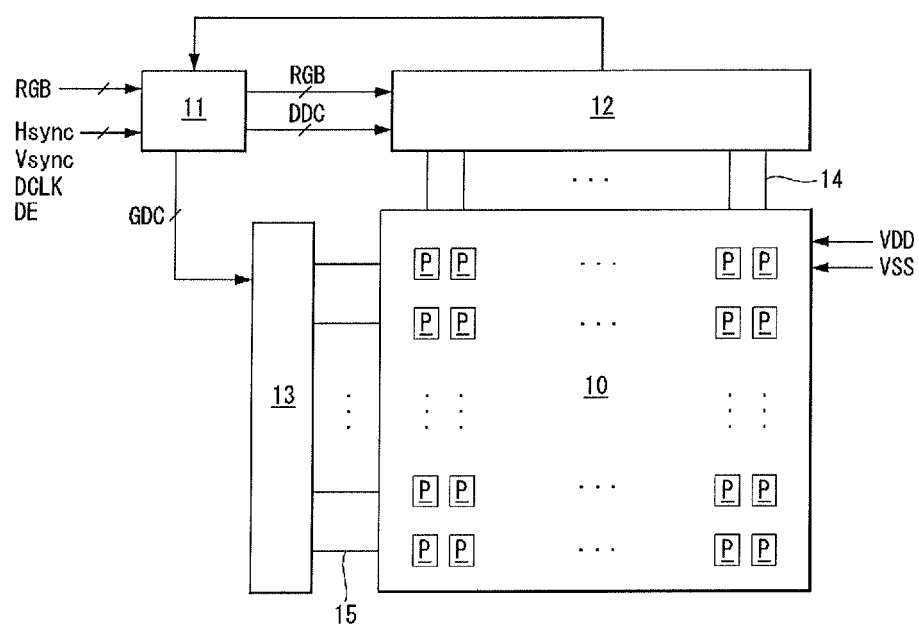
FIG. 5 illustrates an organic light emitting display according to an exemplary embodiment of the invention.

FIG. 5 illustrates an organic light emitting display according to an exemplary embodiment of the invention.

As shown in FIG. 5, an organic light emitting display according to an exemplary embodiment of the invention includes a display panel 10 on which pixels P are arranged in a matrix form, a data driving circuit 12 for driving data lines 14 of the display panel 10, a gate driving circuit 13 for driving gate lines 15 of the display panel 10, and a timing controller 11 for controlling driving timing of the data driving circuit 12 and the gate driving circuit 13.

The display panel 10 includes the plurality of data lines 14, the plurality of gate lines 15 crossing the data lines 14, and the plurality of pixels P respectively positioned at crossings of the data lines 14 and the gate lines 15 in the matrix form. The display panel 10 further includes sensing current supply lines SL (refer to FIG. 6) for sensing a driving current flowing in the pixels P and compensation voltage supply lines CL (refer to FIG. 6) for applying a compensation voltage to the pixels P. The gate lines 15 include scan signal supply lines for supplying a scan signal SCAN (refer to FIG. 6), sensing control signal supply lines for supplying a sensing control signal SEN (refer to FIG. 6), and compensation control signal supply lines for supplying a compensation control signal CP (refer to FIG. 6).

Figure 6:
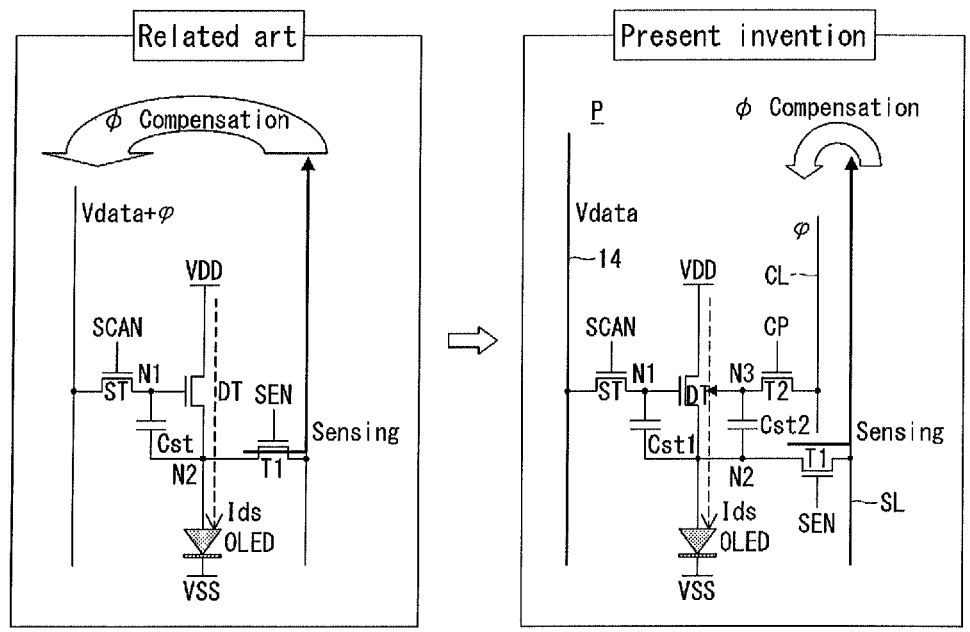
FIG. 6 illustrates a comparison between a compensation method according to an exemplary embodiment of the invention and a related art compensation method.

As shown in FIG. 6, each pixel P includes an organic light emitting diode (OLED), a driving thin film transistor (TFT) DT including two gate electrodes, a switching TFT ST, and a first storage capacitor Cst1. In addition, each pixel P may further include a compensation TFT T2 and a second storage capacitor Cst2. At least one of the pixels P may further include a sensing TFT T1. The driving TFT DT adopts a double gate structure and includes a main gate electrode, to which a data voltage determining the driving current is applied, and a sub-gate electrode, to which a compensation voltage for the compensation of a threshold voltage is applied. The sensing TFT T1 senses a current flowing in the driving TFT DT, thereby sensing the shift of the threshold voltage of the driving TFT DT. The sensing TFT T1 may be included in each pixel P, may be included in each pixel group having at least two pixels P so as to increase an emission area, or may be included in at least one of the pixels P. The compensation TFT T2 applies a compensation voltage φ to the driving TFT DT, thereby recovering the shift of the threshold voltage to an original state. The compensation TFT T2 may be included in each pixel P. The second storage capacitor Cst2 is formed so as to hold the compensation voltage φ for a predetermined period of time. The structure of the pixel P including the sensing TFT T1 and the compensation TFT T2 is not limited to the structure shown in FIG. 6 and may variously changed. In the following description, the structure shown in FIG. 6 is used as an example of the structure of the pixel P for the sake of brevity and ease of reading. Each pixel P is connected to the data line 14, the gate line 15, and the compensation voltage supply line CL and may be additionally connected to the sensing current supply line SL if necessary or desired. Each pixel P receives a high potential cell driving voltage VDD and a low potential cell driving voltage VSS from a power generator (not shown).

The timing controller 11 rearranges digital video data RGB received from the outside in conformity with a resolution of the display panel 10 and supplies the rearranged digital video data RGB to the data driving circuit 12. The timing controller 11 generates a data control signal DDC for controlling operation timing of the data driving circuit 12 and a gate control signal GDC for controlling operation timing of the gate driving circuit 13 based on timing signals, such as a vertical sync signal Vsync, a horizontal sync signal Hsync, a dot clock DCLK, and a data enable signal DE.

The data driving circuit 12 converts the digital video data RGB received from the timing controller 11 into an analog data voltage based on the data control signal DDC and supplies the data voltage to the data lines 14. The data driving circuit 12 differently generates the compensation voltage φ based on a sensing current received from the display panel 10 and supplies the compensation voltage φ to the compensation voltage supply lines CL under the control of the timing controller 11. The compensation voltage φ compensates for changes in the threshold voltage of the driving TFT DT and varies depending on the threshold voltage of the driving TFT DT sensed through the sensing current. The data driving circuit 12 may output the compensation voltage φ suitable for a current threshold voltage of the driving TFT DT with reference to a previously determined first lookup table, in which the compensation voltage φ is stored depending on the threshold voltage of the driving TFT DT. The compensation voltage φ may gradually increase as the threshold voltage of the driving TFT DT is shifted to the right (+). On the contrary, the compensation voltage φ may gradually decrease as the threshold voltage of the driving TFT DT is shifted to the left (−). Because the shift of the threshold voltage of the driving TFT DT is recovered to the original state through the compensation voltage φ, a reduction in the driving current resulting from the shift of the threshold voltage is compensated.

Further, the embodiment of the invention may cause the timing controller 11 to additionally modulate the digital video data RGB supplied to the data driving circuit 12 depending on an amount of the driving current of each pixel P measured in the display panel 10 with reference to a previously determined second lookup table, in which current compensation data is stored depending on the driving current, so as to additionally compensate for the driving current flowing in each pixel P.

The gate driving circuit 13 generates the scan signal SCAN based on the gate control signal GDC. The gate driving circuit 13 supplies the scan signal SCAN to the scan signal supply lines in a line sequential manner. The gate driving circuit 13 may be directly formed on the display panel 10 in a GIP (Gate-driver In Panel) manner. The gate driving circuit 13 may further generate the sensing control signal SEN to be supplied to a gate electrode of the sensing TFT T1 and the compensation control signal CP to be supplied to a gate electrode of the compensation TFT T2 under the control of the timing controller 11. The gate driving circuit 13 may supply the sensing control signal SEN to the sensing control signal supply lines and may supply the compensation control signal CP to the compensation control signal supply lines.

FIG. 6 illustrates a comparison between a compensation method according to the embodiment of the invention and a related art compensation method.

As shown in FIG. 6, the related art compensation method sensed a current Ids flowing in the driving TFT DT to sense the shift of the threshold voltage of the driving TFT DT and greatly modulated a data voltage Vdata by a compensation voltage corresponding to an increase amount 'φ' of the threshold voltage. Afterwards, the related art compensation method applied a modulation voltage (Vdata+φ) to the gate electrode of the driving TFT DT. Namely, when a current characteristic curve of the driving TFT DT is shifted to the right due to an increase in the threshold voltage of the driving TFT DT, the related art compensation method increased only a magnitude of a gate-source voltage of the driving TFT DT while maintaining a shifted state of the current characteristic curve. As a result, according to the related art compensation method, the degradation of the threshold voltage of the driving TFT DT was rather accelerated due to the degradation compensation.

Figure 8A:
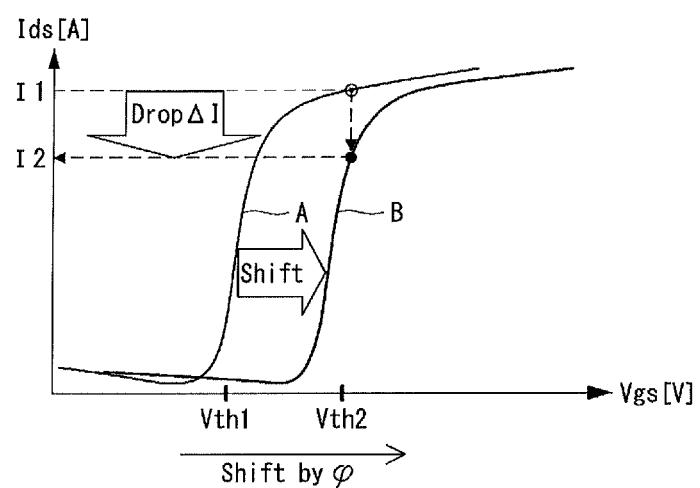
Figure 8B:
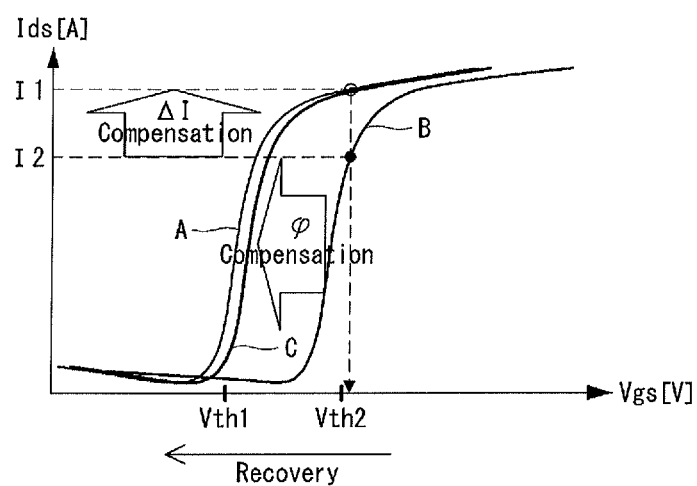

On the other hand, the compensation method according to the embodiment of the invention senses a current Ids flowing in the driving TFT DT to sense the shift of the threshold voltage of the driving TFT DT and applies the compensation voltage φ corresponding to an increase amount of the threshold voltage to the sub-gate electrode of the driving TFT DT, thereby recovering the shift of the threshold voltage to the original state. Namely, as shown in FIGS. 8A and 8B, when a current characteristic curve of the driving TFT DT is shifted to the right due to an increase in the threshold voltage of the driving TFT DT, the compensation method according to the embodiment of the invention again moves the current characteristic curve of the driving TFT DT to an original position.

For this, each pixel P according to the embodiment of the invention may include the OLED, the driving TFT DT having the double gate structure for controlling the current Ids flowing in the OLED, the switching TFT ST which is turned on or off in response to the scan signal SCAN and applies the data voltage Vdata to the main gate electrode of the driving TFT DT, the first storage capacitor Cst1 which is connected between the main gate electrode and the source electrode of the driving TFT DT and stores the data voltage Vdata, the compensation TFT T2 which is turned on or off in response to the compensation control signal CP and applies the compensation voltage φ to the sub-gate electrode of the driving TFT DT, and the second storage capacitor Cst2 which is connected between the sub-gate electrode and the source electrode of the driving TFT DT and stores the compensation voltage φ. Each pixel P according to the embodiment of the invention may further include the sensing TFT T1 which is turned on or off in, response to the sensing control signal SEN to sense a current flowing in the driving TFT DT and applies the sensed current to the data driving circuit 12.

The OLED is connected between the high potential cell driving voltage VDD and the low potential cell driving voltage VSS. The main gate electrode of the driving TFT DT is connected to a first node N1, the sub-gate electrode of the driving TFT DT is connected to a third node N3, the drain electrode of the driving TFT DT is connected to the high potential cell driving voltage VDD, and the source electrode of the driving TFT DT is connected to an anode electrode of the OLED. A gate electrode of the switching TFT ST is connected to the scan signal supply line, a drain electrode of the switching TFT ST is connected to the data line 14, and a source electrode of the switching TFT ST is connected to the first node N1. A gate electrode of the compensation TFT T2 is connected to the compensation control signal supply line, a drain electrode of the compensation TFT T2 is connected to the compensation voltage supply line CL, and a source electrode of the compensation TFT T2 is connected to the third node N3. A gate electrode of the sensing TFT T1 is connected to the sensing control signal supply line, a drain electrode of the sensing TFT T1 is connected to a second node N2, and a source electrode of the sensing TFT T1 is connected to the sensing current supply line SL.

FIGS. 7A to 8B illustrate a compensation principle of the threshold voltage of the driving TFT DT.

Figure 7A:
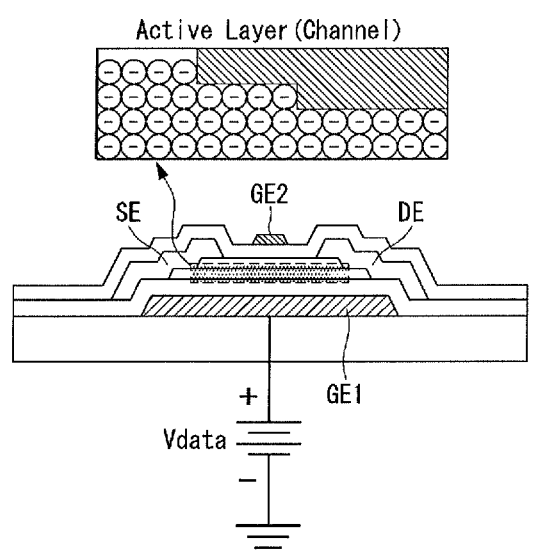
FIGS. 7A to 8B illustrate a compensation principle of a threshold voltage of a driving thin film transistor (TFT)
Figure 7B:
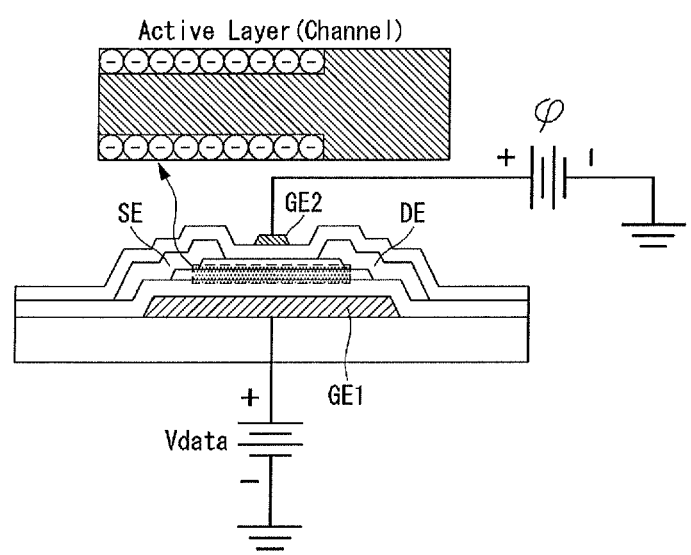

As shown in FIGS. 7A and 7B, the driving TFT DT according to the embodiment of the invention includes a main gate electrode GE1 and a sub-gate electrode GE2 which are respectively positioned over and under an active layer with the active layer used to form a current channel interposed therebetween, and a source electrode SE and a drain electrode DE which are electrically connected to each other through the active layer. The data voltage Vdata is applied to the main gate electrode GE1, and the driving current flowing in the current channel is determined depending on a potential difference between the main gate electrode GE1 and the source electrode SE.

As shown in FIG. 7A, when the positive data voltage Vdata is applied to the main gate electrode GE1 of the driving TFT DT for a long time, electrons (−) are concentrated inside the channel due to a positive stress accumulated on the main gate electrode GE1, and thus a channel resistance increases. Hence, as shown in FIG. 8A, the threshold voltage of the driving TFT DT is shifted from 'Vth1' to 'Vth2' by 'φ', and the current characteristic curve of the driving TFT DT is right shifted from 'A' to 'B'. As a result, a current flowing between the drain and source electrodes of the driving TFT DT is reduced from 'I1' to 'I2' by 'ΔI' under the same conditions.

In this state, as shown in FIG. 7B, when the compensation voltage corresponding to 'φ' is applied to the sub-gate electrode GE2 of the driving TFT DT, the electrons (−) inside the channel are distributed, and thus the channel resistance decreases. Hence, as shown in FIG. 8B, the threshold voltage of the driving TFT DT is recovered from 'Vth2' near to 'Vth1', and the current characteristic curve of the driving TFT DT is left shifted from 'B' to 'C'. As a result, the current flowing between the drain and source electrodes of the driving TFT DT is compensated from 'I2' to 'I1' by 'ΔI' under the same conditions.

Figure 9:
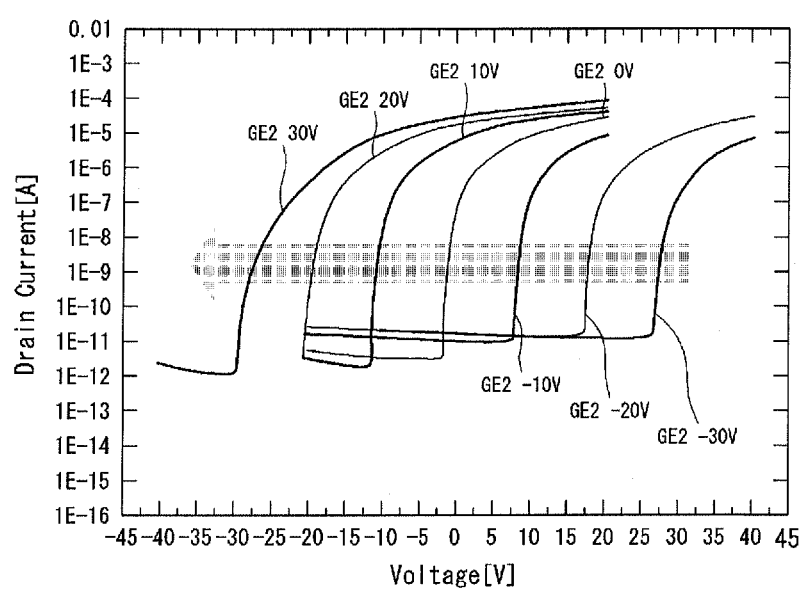
FIG. 9 illustrates electrical characteristics of a double gate type driving TFT.

FIG. 9 illustrates electrical characteristics of the double gate type driving TFT DT.

As shown in FIG. 9, as a bias voltage applied to the sub-gate electrode of the double gate type driving TFT DT increases, the electrical characteristics of the driving TFT DT gradually change. When the bias voltage applied to the sub-gate electrode increases to −30V, −20V, −10V, 0V, 10V, 20V, and 30V, the threshold voltage and the current characteristic curve of the driving TFT DT are gradually shifted to the left in proportion to a magnitude of the bias voltage.

Figure 10:
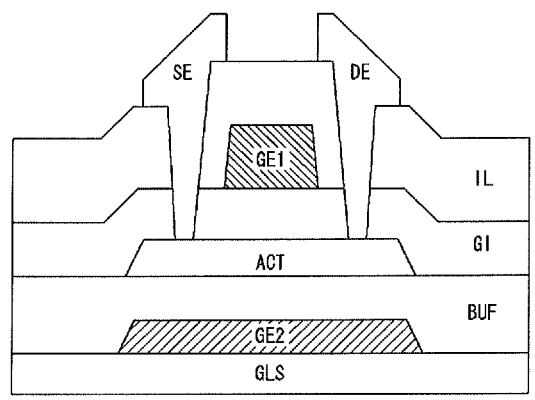
FIGS. 10 and 11 illustrate kinds of a double gate type driving TFT capable of performing a bidirectional control.
Figure 11:
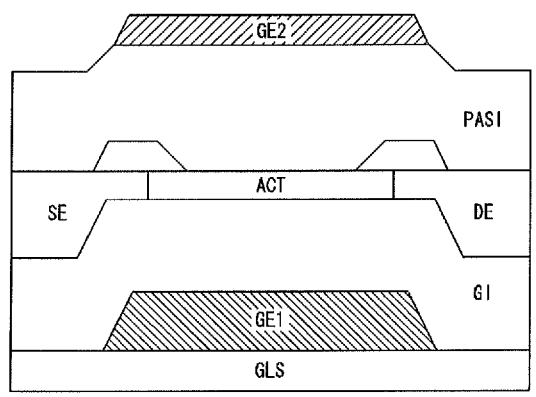

FIGS. 10 and 11 illustrate kinds of the double gate type driving TFT DT capable of performing a bidirectional control.

As shown in FIG. 10, a double gate type driving TFT DT according to the embodiment of the invention includes a sub-gate electrode GE2 formed under an active layer ACT in a coplanar structure, in which all of a main gate electrode GE1, a source electrode SE, and a drain electrode DE are positioned over the active layer ACT. More specifically, in the double gate type driving TFT DT having the coplanar structure, the sub-gate electrode GE2 is formed on a substrate GLS, and a buffer layer BUF is formed between the sub-gate electrode GE2 and the active layer ACT. Further, a gate insulating layer GI, the main gate electrode GE1, and an interlayer dielectric layer IL are sequentially formed over the active layer ACT. A source electrode and a drain electrode are formed so that they pass through the interlayer dielectric layer IL and the gate insulating layer GI and are connected to the active layer ACT.

As shown in FIG. 11, a double gate type driving TFT DT according to the embodiment of the invention includes a sub-gate electrode GE2 formed over an active layer ACT in an inverted coplanar structure, in which all of a main gate electrode GE1, a source electrode SE, and a drain electrode DE are positioned under the active layer ACT. More specifically, in the double gate type driving TFT DT having the inverted coplanar structure, the main gate electrode GE1 and a gate insulating layer GI are sequentially formed on a substrate GLS, and the active layer ACT, the source electrode SE, and the drain electrode DE are simultaneously formed on the gate insulating layer GI. Further, a passivation layer PASI covering the active layer ACT, the source electrode SE, and the drain electrode DE is formed, and the sub-gate electrode GE2 is formed on the passivation layer PASI.

Figure 12A:
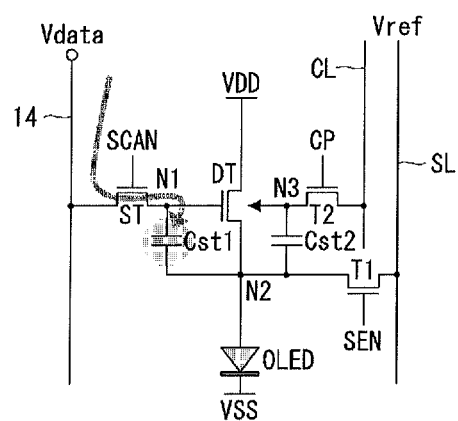
FIGS. 12A to 12C sequentially illustrate a method of compensating for a threshold voltage according to an exemplary embodiment of the invention.
Figure 12B:
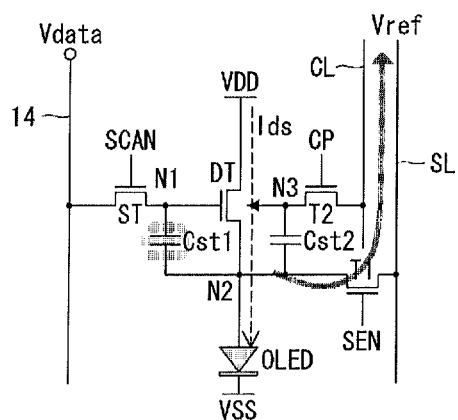
Figure 12C:
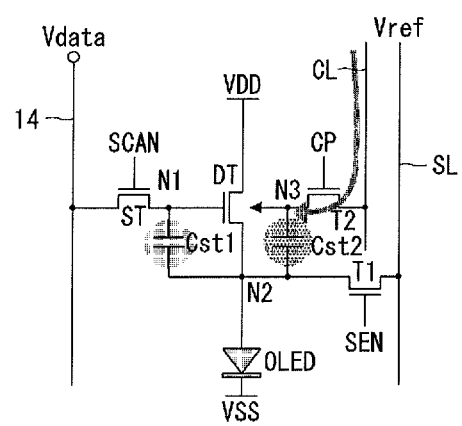

FIGS. 12A to 12C sequentially illustrate a method of compensating for the threshold voltage according to the embodiment of the invention. More specifically, FIGS. 12A to 12C illustrate an operation of a pixel further including a sensing TFT T1 as an example. All of remaining operations except a sensing operation of a driving current described later are applied to a pixel not including the sensing TFT T1.

As shown in FIG. 12A, the embodiment of the invention turns on the switching TFT ST and applies the data voltage Vdata to the first storage capacitor Cst1 connected to the main gate electrode of the driving TFT DT, thereby storing the data voltage Vdata in the first storage capacitor Cst1. As shown in FIG. 12B, the driving current Ids flows between the drain electrode and the source electrode of the driving TFT DT by a voltage between both terminals of the first storage capacitor Cst1, i.e., the gate-source voltage of the driving TFT DT. In this state, the embodiment of the invention turns on the sensing TFT T1 and senses the driving current Ids flowing in the driving TFT DT. The embodiment of the invention supplies the driving current Ids to the data driving circuit.

The embodiment of the invention produces the compensation voltage corresponding to the driving current Ids in the data driving circuit. The embodiment of the invention turns on the compensation TFT T2 and applies the compensation voltage to the second storage capacitor Cst2 connected to the sub-gate electrode of the driving TFT DT, thereby storing the compensation voltage in the second storage capacitor Cst2. The shift of the threshold voltage resulting from the gate bias stress applied to the main gate electrode is recovered by the compensation voltage applied to the sub-gate electrode.

As described above, the embodiment of the invention includes the double gate type driving TFT having the two gate electrodes and applies the compensation voltage corresponding to a change amount of the threshold voltage of the driving TFT to the sub-gate electrode of the driving TFT, thereby recovering the shift of the threshold voltage to the original state. Hence, the embodiment of the invention solves the related art problems of the acceleration of the degradation in the compensation process and a limitation of the compensation range. The embodiment of the invention efficiently compensates for the degradation of the threshold voltage, thereby preventing a drive failure resulting from a long drive and improving the reliability. Further, the embodiment of the invention increases the uniformity of the luminance and greatly increases the life span of the products.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display comprising:
   a display panel including a plurality of pixels to display an image; and
   a data driving circuit configured to differently output a compensation voltage depending on a sensing value based on a driving current,
   wherein each of the plurality of pixels includes:
      an organic light emitting diode;
      a first thin film transistor (TFT) having a double gate structure including a main gate electrode connected to a first node and a sub-gate electrode connected to a third node;
      a second TFT configured to apply a data voltage determining the driving current to the main gate electrode of the first TFT;
      a first storage capacitor connected to the first node and a second node between the organic light emitting diode and a source electrode of the first TFT;
      a second storage capacitor connected to the third node and the second node; and
      a third TFT connected to the sub-gate electrode of the first TFT,
   wherein at least one of the plurality of pixels further includes a fourth TFT connected to the second node,
   wherein the second storage capacitor has a first terminal connected to the sub-gate electrode of the first TFT and the third TFT, and a second terminal directly connected to the fourth TFT and the organic light emitting diode, wherein during a first period, the second TFT is turned on and the driving current corresponding to the data voltage flows through the first TFT, wherein during a second period subsequent to the first period, the fourth TFT is turned on and the data driving circuit senses the driving current through the fourth TFT to generate the compensation voltage, wherein during a third period subsequent to the second period, the third TFT is turned on and the data driving circuit applies the compensation voltage to the sub-gate electrode of the first TFT through the third TFT, thereby recovering a shift of a threshold voltage of the first TFT to an original state, and wherein a magnitude of the compensation voltage is determined according to a threshold voltage shift amount of the first TFT.

2. The organic light emitting display of claim 1, wherein the fourth TFT is included in each of a plurality of pixel groups having at least two pixels.

3. The organic light emitting display of claim 1, wherein the data driving circuit outputs the compensation voltage corresponding to the threshold voltage with reference to a first lookup table, in which the compensation voltage is stored depending on the threshold voltage.

4. The organic light emitting display of claim 3, wherein the compensation voltage gradually increases as the threshold voltage of the first TFT is shifted to a positive direction, and gradually decreases as the threshold voltage of the first TFT is shifted to a negative direction.

5. The organic light emitting display of claim 1, wherein the first TFT is implemented as a coplanar structure, in which all of the main gate electrode, a source electrode, and a drain electrode are positioned over an active layer, wherein the sub-gate electrode is formed under the active layer.

6. The organic light emitting display of claim 1, wherein the first TFT is implemented as an inverted coplanar structure, in which all of the main gate electrode, a source electrode, and a drain electrode are positioned under an active layer, wherein the sub-gate electrode is formed over the active layer.

7. The organic light emitting display of claim 1, further comprising a timing controller configured to modulate digital video data supplied to the data driving circuit depending on an amount of a driving current of each pixel measured in the display panel with reference to a lookup table, in which current compensation data is previously stored depending on the driving current.

8. The organic light emitting display of claim 1, wherein the first TFT is a driving TFT, the second TFT is a switching TFT, the third TFT is a compensation TFT, and the fourth TFT is a sensing TFT.

9. A device, comprising:
a display panel;
a data driving circuit configured to differently output a compensation voltage depending on a sensing value based on a driving current; and
a pixel in the display panel, the pixel including:
   an organic light emitting diode;
   a first thin film transistor (TFT), the first TFT having a dual-gate structure including a main gate electrically coupled to a first node and a secondary gate electrically coupled to a third node;
   a second TFT electrically coupled between a data line and the first node, the second TFT configured to supply a data voltage from the data line to the main gate of the first TFT, the driving current being determined by the data voltage;
   a first capacitor having a first terminal electrically coupled to the first node and second terminal electrically coupled to a second node, the second node being electrically coupled to the organic light emitting diode and a source electrode of the first TFT;
   a second capacitor having a first terminal electrically coupled to the third node, and a second terminal electrically coupled to the second node;
   a third TFT electrically coupled to the third node; and
   a fourth TFT electrically coupled to the second node,
wherein the device is configured to:
   turn on the second TFT and supply the driving current corresponding to the data voltage through the first TFT, during a first period,
   turn on the fourth TFT and sense, by the data driving circuit, the driving current through the fourth TFT to generate the compensation voltage, during a second period subsequent to the first period, and
   turn on the third TFT and apply, by the data driving circuit, the compensation voltage to the secondary gate of the first TFT through the third TFT, thereby recovering a shift of a threshold voltage of the first TFT to an original state, during a third period subsequent to the second period,
wherein a magnitude of the compensation voltage is determined according to a threshold voltage shift amount of the first TFT.

10. The device of claim 9, wherein the data driving circuit outputs the compensation voltage corresponding to the threshold voltage with reference to a first lookup table, in which the compensation voltage is stored depending on the threshold voltage.

11. The device of claim 10, wherein the compensation voltage gradually increases as the threshold voltage of the first TFT is shifted to a positive direction, and gradually decreases as the threshold voltage of the first TFT is shifted to a negative direction.

* * * * *